US012721439B2

(12) United States Patent
You et al.

(10) Patent No.: US 12,721,439 B2
(45) Date of Patent: Sep. 1, 2026

(54) ANGLE ADJUSTING STRUCTURE FOR DISPLAY

(71) Applicant: NINGBO TUOTUO RIVER DESIGN COMPANY, Ningbo (CN)

(72) Inventors: Xiaodong You, Ningbo (CN); Hongjun Wang, Ningbo (CN)

(73) Assignee: NINGBO TUOTUO RIVER DESIGN COMPANY, Ningbo (CN)

( * ) Notice: Subject to any disclaimer, the term of this patent is extended or adjusted under 35 U.S.C. 154(b) by 83 days.

(21) Appl. No.: 18/854,335

(22) PCT Filed: Mar. 27, 2023

(86) PCT No.: PCT/CN2023/084061

§ 371 (c)(1),
(2) Date: Oct. 4, 2024

(87) PCT Pub. No.: WO2023/226579

PCT Pub. Date: Nov. 30, 2023

(65) Prior Publication Data

US 2025/0241442 A1 Jul. 31, 2025

(30) Foreign Application Priority Data

May 26, 2022 (CN) ......................... 202221347188.3

(51) Int. Cl.
*A47B 97/00* (2006.01)
*F16M 11/10* (2006.01)
*H05K 5/02* (2006.01)

(52) U.S. Cl.
CPC ........... *A47B 97/001* (2013.01); *F16M 11/10* (2013.01); *H05K 5/0204* (2013.01)

(58) Field of Classification Search
CPC ...... F16M 11/10; F16M 11/16; F16M 13/022; A47B 97/001; H05K 5/0204
See application file for complete search history.

(56) References Cited

U.S. PATENT DOCUMENTS 7,152,836 B2 * 12/2006 Pfister .................. F16C 11/103 248/920
7,178,775 B2 * 2/2007 Pfister .................... F16M 11/10 248/920

(Continued)

FOREIGN PATENT DOCUMENTS

CN 201391725 Y 1/2010
CN 202281014 U 6/2012
CN 203731045 U 7/2014

OTHER PUBLICATIONS

International Search Report dated Jul. 6, 2023 issued in PCT/CN2023/084061.

*Primary Examiner* — Monica E Millner
(74) *Attorney, Agent, or Firm* — Scully, Scott, Murphy & Presser, P.C.

(57) ABSTRACT

An angle adjusting structure for a display is provided. The angle adjusting structure includes at least one first support, at least one second support and at least one up-down tilt adjusting structure. The at least one second support can be connected to an element to be adjusted. The at least one up-down tilt adjusting structure is arranged on the at least one first support and the at least one second support and is configured to enable each of the at least one second support to rotate relative to a corresponding first support in the at least one first support. The position of a virtual pivot shaft of the second support is not fixed.

15 Claims, 3 Drawing Sheets

(56) References Cited

U.S. PATENT DOCUMENTS

| | | | | |
|---|---|---|---|---|
| 7,395,996 | B2 * | 7/2008 | Dittmer | F16M 11/10 248/291.1 |
| 7,641,163 | B2 * | 1/2010 | O'Keene | F16M 11/10 248/920 |
| 8,235,342 | B2 | 8/2012 | Pfister | |
| 8,456,808 | B2 * | 6/2013 | Grey | F16M 11/10 361/679.01 |
| 8,870,140 | B2 | 10/2014 | Stemple | |
| 9,004,430 | B2 | 4/2015 | Conner | |
| 9,062,821 | B2 | 6/2015 | Jensen | |
| 9,976,697 | B2 | 5/2018 | Molter | |
| 10,024,490 | B2 | 7/2018 | Lam | |
| 10,125,921 | B2 | 11/2018 | Khodapanah | |
| 10,309,578 | B2 | 6/2019 | Yen | |
| 10,578,245 | B2 | 3/2020 | Stifal | |
| 12,163,621 | B2 | 12/2024 | Xu | |
| 12,295,493 | B2 | 5/2025 | Newville | |
| 12,460,769 | B2 | 11/2025 | Glickstein | |
| 2006/0065800 | A1 * | 3/2006 | Bremmon | F16M 13/02 248/274.1 |
| 2007/0176067 | A1 * | 8/2007 | Monaco | F16M 13/02 248/284.1 |
| 2008/0315049 | A1 | 12/2008 | Bailo | |
| 2010/0012799 | A1 * | 1/2010 | Sexton | F16M 11/10 248/225.21 |
| 2011/0174939 | A1 * | 7/2011 | Taylor | F16M 11/10 24/565 |
| 2017/0127833 | A1 * | 5/2017 | Hung | A47B 97/001 |
| 2024/0209979 | A1 | 6/2024 | Newville | |

* cited by examiner

ANGLE ADJUSTING STRUCTURE FOR DISPLAY

CROSS-REFERENCE TO RELATED APPLICATIONS

This application is a National Stage Entry under 35 U.S.C. § 371 of PCT International Application No. PCT/CN2023/084061 filed on Mar. 27, 2023, which claims priority to Chinese Patent Application No. 202221347188.3 filed on May 26, 2022, the entire contents of each of which are incorporated herein by reference for all purposes.

TECHNICAL FIELD

The present disclosure relates to the technical field of display supports, specifically to an angle adjusting structure for a display.

BACKGROUND

At present, after an existing angle adjusting structure for a display adjusts the display to a required angle, an additional locking element is needed to fix the display at the required angle. The display cannot be automatically locked at the required angle, so that the angle adjusting operation is relatively complicated.

SUMMARY

The main purpose of the present disclosure is to provide an angle adjusting structure for a display to solve the problem in the related art that the display cannot be automatically locked at a certain angle.

According to one aspect of the present disclosure, an angle adjusting structure for a display is provided, including: at least one first support; at least one second support which can be connected to an element to be adjusted; and at least one up-down tilt adjusting structure which is arranged on the at least one first support and the at least one second support and is configured to enable each of the at least one second support to rotate relative to a corresponding first support in the at least one first support, wherein a position of a virtual pivot shaft of the each of the at least one second support is not fixed.

Further, the pivot shaft passes through a gravity center of the element to be adjusted.

Further, two up-down tilt adjusting structures are provided, each of the two up-down tilt adjusting structures includes an arc-shaped sliding groove, a mounting hole and a first adjusting element, the first adjusting element is inserted in the arc-shaped sliding groove and the mounting hole, the first adjusting element is in sliding fit with the arc-shaped sliding groove, and centers of circles where the two arc-shaped sliding grooves of the two up-down tilt adjusting structures are located do not coincide.

Further, one of the at least one first support and the at least one second support is provided with the two arc-shaped sliding grooves, and the other one of the at least one first support and the at least one second support is provided with two mounting holes of the two up-down tilt adjusting structures arranged at an interval.

Further, the centers of circles where the two arc-shaped sliding grooves are located are both located on a side of the at least one first support or the at least one second support away from the pivot shaft.

Further, the centers of circles where the two arc-shaped sliding grooves are located are both located on a side of the at least one first support or the at least one second support close to the pivot shaft.

Further, the first adjusting element includes a first abutting block and a first sliding element connected to the first abutting block, the first sliding element is inserted in the arc-shaped sliding groove and the mounting hole, and the first abutting block abuts against a surface of a corresponding second support of the at least one second support.

Further, the angle adjusting structure for the display further includes second adjusting elements, the second adjusting elements are arranged between each of the at least one second support and a corresponding first support of the at least one first support, each of the second adjusting elements can be in sliding fit with a corresponding arc-shaped sliding groove of the two arc-shaped sliding grooves, and the second adjusting elements are provided with assembly holes for the two first adjusting elements to penetrate through.

Further, each of the second adjusting elements includes a second abutting block and a second sliding element connected to the second abutting block, the second sliding element is in sliding fit with the arc-shaped sliding groove, and the second abutting block is clamped between the each of the at least one second support and the corresponding first support.

Further, the angle adjusting structure for the display further includes a supporting frame, and the at least one first support is connected to the supporting frame; and the angle adjusting structure for the display comprises two first supports, and the first supports are slidably connected to the supporting frame.

By applying the technical solutions of the present disclosure, the first support is connected to a base surface to be mounted, and the second support is connected to the display. In this way, under the action of the up-down tilt adjusting structure, the second support can drive the display to rotate relative to the base surface to be mounted, thereby achieving the effect of adjusting an angle. In addition, under the action of the display's gravity, when the second support rotates to a certain angle relative to the first support, the second support can be maintained at this angle position relative to the first support, thereby achieving the effect of locking the display at a certain angle. Due to the fact that during the rotation of the second support relative to the first support, the position of the pivot shaft of the second support changes with the rotation of the second support, during the rotation of the second support, the pivot shaft of the second support can be always overlapped or almost overlapped with the gravity center of the display, so as to ensure that the display can be locked at a certain angle.

BRIEF DESCRIPTION OF THE DRAWINGS

The accompanying drawings of the specification that constitute a part of the present application are used to provide a further understanding of the present disclosure. The exemplary embodiments of the present disclosure and the descriptions thereof are used to explain the present disclosure, and do not constitute an improper limitation on the present disclosure. In the accompanying drawings.

Figure 1:
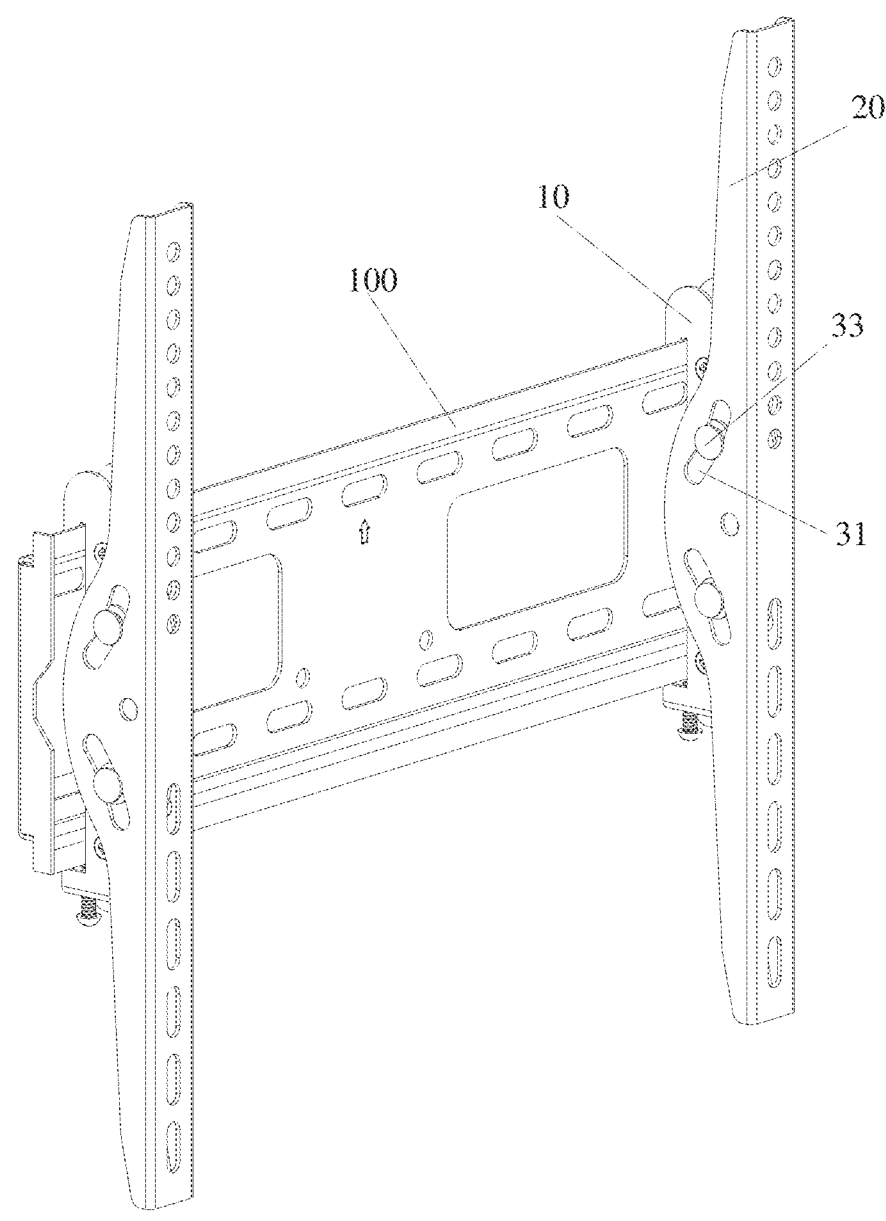
FIG. 1 shows a schematic structural view of an embodiment of an angle adjusting structure for a display according to the present disclosure.

The above accompanying drawings have the following reference numerals:

10. first support; 20. second support; 30. up-down tilt adjusting structure; 31. arc-shaped sliding groove; 32. mounting hole; 33. first adjusting element; 331. first abutting block; 332. first sliding element; 34. second adjusting element; 341. assembly hole; 342. second abutting block; 343. second sliding element; 35. assembly hole; 100. supporting frame.

DETAILED DESCRIPTION OF EMBODIMENTS

It should be noted that in the case of no conflict, embodiments in the present application and features in the embodiments may be combined with each other. The present disclosure will be described in detail below with reference to the accompanying drawings in conjunction with the embodiments.

Figure 2:
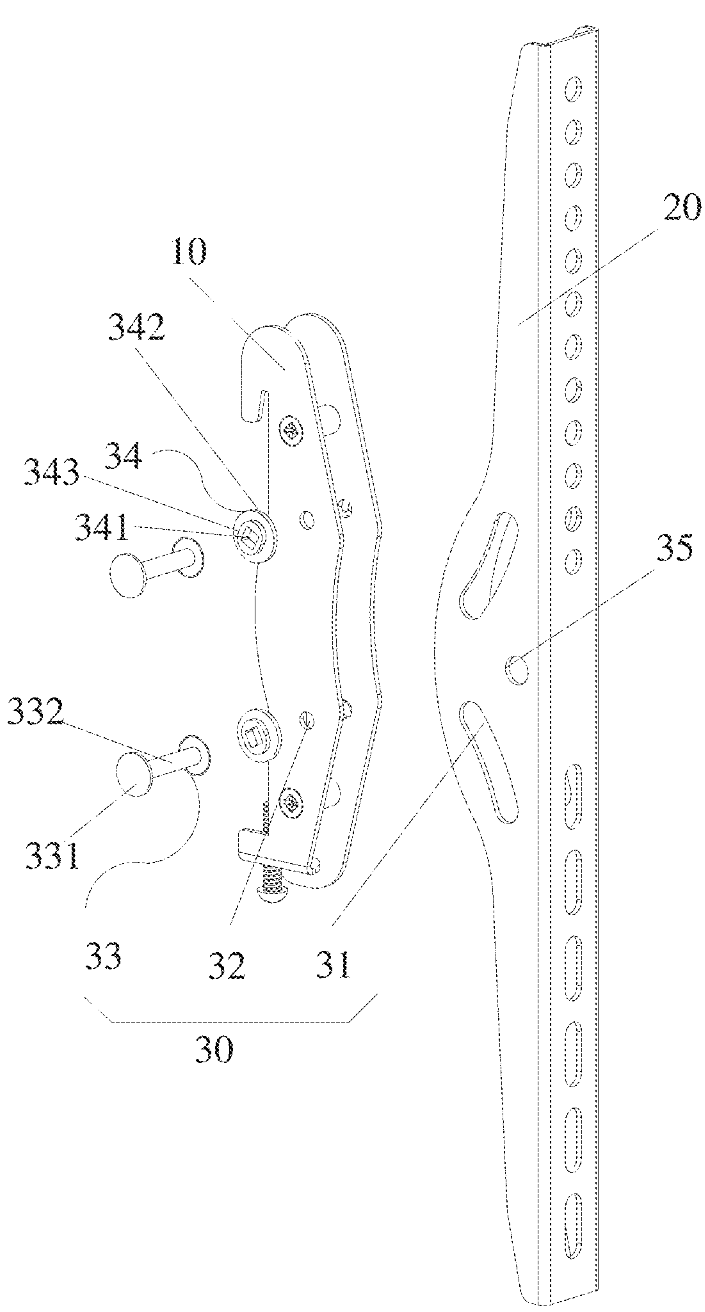
FIG. 2 shows an exploded view of the angle adjusting structure for the display according to FIG. 1 (wherein the supporting frame is not shown)

As shown in FIG. 1 and FIG. 2, an embodiment of the present disclosure provides an angle adjusting structure for a display. The angle adjusting structure for the display includes at least one first support 10, at least one second support 20 and at least one up-down tilt adjusting structure 30, wherein the at least one second support 20 can be connected to an element to be adjusted; and the at least one up-down tilt adjusting structure 30 is arranged on the first support 10 and the second support 20 and is configured to enable each of the at least one second support 20 to rotate relative to the corresponding first support 10, wherein a position of a virtual pivot shaft of the each second support 20 is not fixed, and the pivot shaft passes through the gravity center of the element to be adjusted.

In the above technical solution, the first support 10 is connected to a base surface to be mounted (such as a wall surface or a table top), and the second support 20 is connected to the element to be adjusted (such as a display or a table board). In this way, under the action of the up-down tilt adjusting structure 30, the second support 20 can drive the display to rotate relative to the base surface to be mounted, thereby achieving the effect of adjusting an angle.

It should be noted that "the pivot shaft of the second support 20 passes through the gravity center of the display" means that during the rotation of the second support 20, the pivot shaft of the second support 20 is overlapped or almost overlapped with the gravity center of the display, in this way, under the action of the display's gravity, when the second support 20 rotates to a certain angle relative to the first support 10, the second support 20 can be maintained at this angle position relative to the first support 10, thereby achieving the effect of locking the display at a certain angle. Due to the fact that during the rotation of the second support 20 relative to the first support 10, the position of the pivot shaft of the second support 20 changes with the rotation of the second support 20, in this way, during the rotation of the second support 20, the pivot shaft of the second support 20 can be always overlapped or almost overlapped with the gravity center of the display, so as to ensure that the display can be locked at a certain angle.

In addition, it should be noted that "the pivot shaft of the second support 20 is virtual" means that the pivot shaft of the second support 20 is an intangible pivot point, rather than formed by a solid structure such as a pin or a rotating shaft; and "the pivot shaft of the second support 20 is not fixed" means that the position of the pivot shaft of the second support 20 is movable, and specifically, during the rotation of the second support 20 relative to the first support 10, the position of the pivot shaft of the second support 20 changes with the rotation of the second support 20.

As shown in FIG. 2, in the embodiment of the present disclosure, two up-down tilt adjusting structures 30 are provided, and the two up-down tilt adjusting structures 30 are arranged between one first support 10 and one second support 20, each of the up-down tilt adjusting structures 30 includes an arc-shaped sliding groove 31, a mounting hole 32 and a first adjusting element 33, the first adjusting element 33 is inserted in the arc-shaped sliding groove 31 and the mounting hole 32, the first adjusting element 33 is in sliding fit with the arc-shaped sliding groove 31, and the centers of circles where two arc-shaped sliding grooves 31 of the two up-down tilt adjusting structures 30 are located do not coincide.

In some embodiments, the first support 10 is provided with two mounting holes 32, the second support 20 is provided with two arc-shaped sliding grooves 31, there are two first adjusting elements 33, and each of the two first adjusting elements 33 passes through a corresponding arc-shaped sliding groove 31 and a corresponding mounting hole 32. During the rotation of the second support 20, the first adjusting element 33 slides along the corresponding arc-shaped sliding groove 31. In this way, the second support 20 can rotate relative to the first support 10 within a preset angle range, thereby achieving the effect of adjusting the angle of the display.

According to the above arrangement, because the position of the gravity center of the display changes during the rotation of the second support 20, by arranging the two up-down tilt adjusting structures 30, during the rotation of the second support 20 relative to the first support 10, the position of the pivot shaft of the second support 20 also changes. In this way, during the rotation of the second support 20, the pivot shaft of the second support 20 can be always overlapped or almost overlapped with the gravity center of the display, so as to ensure that the display can be locked at a certain angle. Furthermore, the centers of circles where the two arc-shaped sliding grooves 31 are located do not coincide. This arrangement can ensure that the position of the pivot shaft of the second support 20 is movable, thereby achieving the effect of locking the display at a certain angle.

Of course, in the embodiments not shown in the accompanying drawings of the present disclosure, two arc-shaped sliding grooves 31 can be arranged on the first support 10, and two mounting holes 32 can be arranged on the second support 20, thereby also achieving the effect of adjusting the angle of the display and locking the display at a certain angle.

As shown in FIG. 2, in the embodiment of the present disclosure, according to a conventional operating direction of a user, the centers of circles where the two arc-shaped sliding grooves 31 are located are both located on a side of the second support 20 away from the pivot shaft. In this way, compared to a forward single arc (meaning that the center of a circle where the arc is located is located on a side of the second support facing the pivot shaft) or a concentric arc, in the technical solution of the present disclosure, in a case that the difference between up and down adjusting angles is larger, the distance between the display or the second support 20 and the base surface to be mounted is smaller during the rotation of the second support 20 relative to the first support 10. By this arrangement, the angle adjusting structure for a display is smaller in overall size and also smaller in occupied space.

Figure 3:
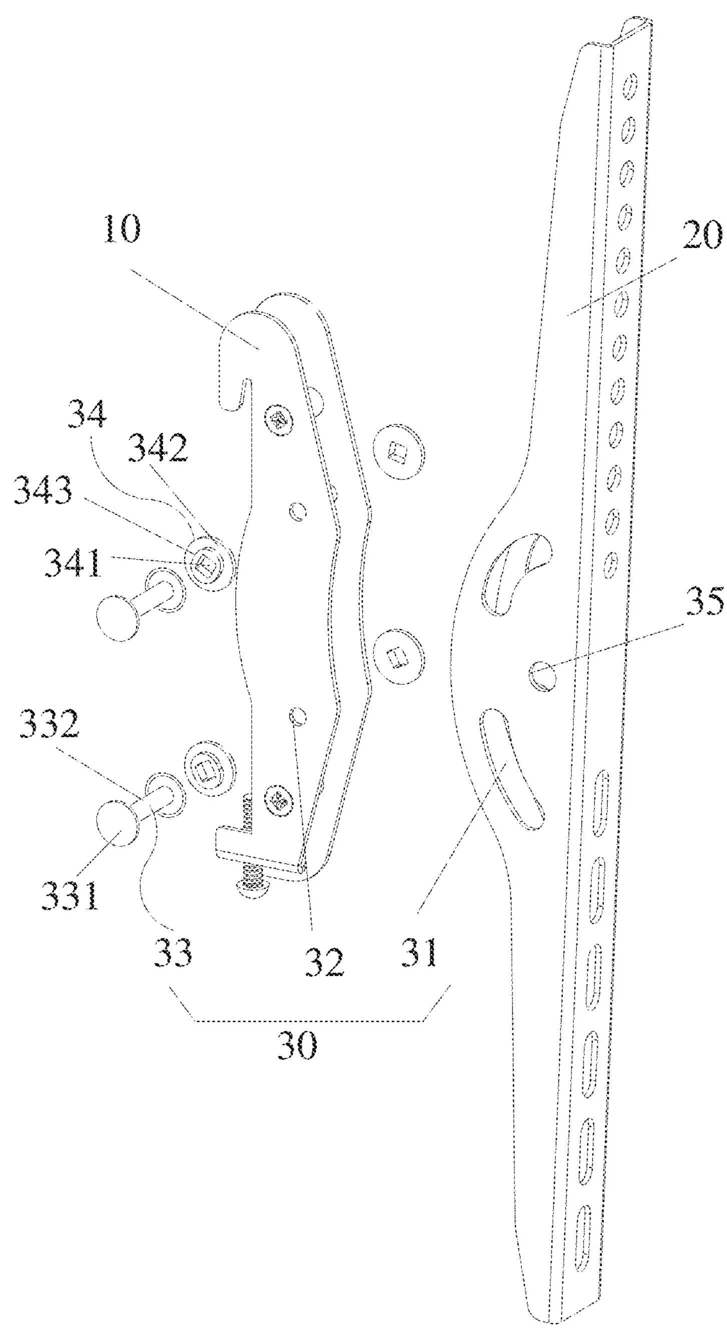
FIG. 3 shows an exploded view of another embodiment of an angle adjusting structure for a display according to the present disclosure (wherein the supporting frame is not shown).

Of course, as shown in FIG. 3, according to the actual structure and size requirements, the centers of circles where the two arc-shaped sliding grooves 31 are located may also be both located on a side of the second support 20 close to the pivot shaft.

It should be noted that when the two arc-shaped sliding grooves 31 are both located on the first support 10, according to actual requirements, the centers of circles where the two arc-shaped sliding grooves 31 are located may be both located on the side of the first support 10 away from the pivot shaft; or, the centers of circles where the two arc-shaped sliding grooves 31 are located may be both located on the side of the first support 10 close to the pivot shaft.

Specifically, as shown in FIG. 2, in the embodiment of the present disclosure, the second support 20 is provided with a protruding part protruding towards the first support 10, and the two arc-shaped sliding grooves 31 are both arranged on the protruding part. In this way, the distance between the second support 20 and both ends of the first support 10 can be increased, thereby increasing the angle at which the second support 20 rotates around the first adjusting element 33.

As shown in FIG. 2, in the embodiment of the present disclosure, the first adjusting element 33 includes a first abutting block 331 and a first sliding element 332 connected to the first abutting block 331, the first sliding element 332 is inserted in the corresponding arc-shaped sliding groove 31 and the corresponding mounting hole 32, and the first abutting block 331 abuts against a surface of the corresponding second support 20.

According to the above arrangement, by the connection of the first adjusting element 33, the second support 20 and the first support 10 can rotate relative to each other, thereby achieving the effect of adjusting the angle of the display. An outer diameter of the first abutting block 331 is greater than an outer diameter of the first sliding element 332. In this way, by enabling the first abutting block 331 to abut against the surface of the second support 20, the first abutting block 331 can limit the first adjusting element 33 in an axial direction of the first adjusting element 33, thereby preventing the first adjusting element 33 from detaching from the mounting hole 32 and the arc-shaped sliding groove 31.

As shown in FIG. 2, in the embodiment of the present disclosure, the second support 20 is further provided with an assembly hole 35 located between the two arc-shaped sliding grooves 31, and the assembly hole 35 can be matched with a pin column on the display to facilitate the mounting of the display.

As shown in FIG. 2, in one embodiment of the present disclosure, the angle adjusting structure for the display further includes second adjusting elements 34, the second adjusting element 34 is arranged between the second support 20 and the first support 10, the second adjusting element 34 can be in sliding fit with the corresponding arc-shaped sliding groove 31, and the second adjusting element 34 is provided with an assembly hole 341 for the first adjusting element 33 to penetrate through.

In the above technical solution, the second adjusting element 34 includes a second abutting block 342 and a second sliding element 343 connected to the second abutting block 342, wherein the second sliding element 343 is in sliding fit with the corresponding arc-shaped sliding groove 31, the second abutting block 342 is clamped between the second support 20 and the first support 10, and the assembly hole 341 penetrates through the second abutting block 342 and the second sliding element 343.

By the above arrangement, the second abutting block 342 can achieve a buffering effect. During the rotation of the second support 20 relative to the first support 10, the second abutting block 342 can avoid larger resistance caused by direct contact between the first support 10 and the second support 20, thereby ensuring smoother rotation between the first support 10 and the second support 20.

In some embodiments, the second adjusting element 34 is a pin shaft or a screw with external threads. Correspondingly, the mounting hole 32 is a light hole or a threaded hole.

As shown in FIG. 1, in the embodiment of the present disclosure, the angle adjusting structure for the display further includes a supporting frame 100, and the first support 10 is connected to the supporting frame 100.

In the above technical solution, the supporting frame 100 is connected to the base surface to be mounted. In this way, the first support 10 can be connected to the base surface to be mounted through the supporting frame 100. In the embodiments, two first supports 10 are provided, the two first supports 10 are slidably connected to the supporting frame 100, two second supports 20 are also provided, and the two second supports 20 are corresponding to the two first supports 10. In this way, both ends of the display are connected to the base surface to be mounted through the angle adjusting structure for the display, the process of adjusting the angle of the display is more stable, and shaking can be reduced. Furthermore, by moving the two first supports 10, the distance between the two first supports 10 can be adjusted. In this way, the angle adjusting structure for the display can be applied to various displays of different sizes.

From the above description, it can be seen that the above embodiments of the present disclosure achieve the following technical effects: the first support is connected to the base surface to be mounted, and the second support is connected to the element to be adjusted. In this way, under the action of the up-down tilt adjusting structure, the second support can drive the element to be adjusted to rotate relative to the base surface to be mounted, thereby achieving the effect of adjusting an angle. Furthermore, during the rotation of the second support relative to the first support, the position of the pivot shaft of the second support changes with the rotation of the second support. In addition, under the action of gravity of the element to be adjusted, when the second support rotates to a certain angle relative to the first support, the second support can be maintained at this angle position relative to the first support, thereby achieving the effect of locking the element to be adjusted at a certain angle. By arranging the two up-down tilt adjusting structures, during the rotation of the second support relative to the first support, the position of the pivot shaft of the second support also changes. In this way, the pivot shaft of the second support can be always overlapped or almost overlapped with the gravity center of the display, so as to ensure that the display can be locked at a certain angle. The centers of circles where the two arc-shaped sliding grooves are located do not coincide. This arrangement can ensure that the position of the pivot shaft of the second support is movable, thereby achieving the effect of locking the display at a certain angle. By means of the connection of the first adjusting element, the second support and the first support can rotate relative to each other, thereby achieving the effect of adjusting the angle of the display. The second abutting block can avoid larger resistance caused by direct contact between the first support and the second support, thereby ensuring smoother rotation between the first support and the second support. By moving the two first supports, the distance between the two first supports can be adjusted. In this way, the angle adjusting structure for a display can be applied to various displays of different sizes.

The above descriptions are only preferred embodiments of the present disclosure, but are not intended to limit the present disclosure. It will be apparent to those skilled in the art that various modifications and changes can be made in the present disclosure. Any modifications, equivalent substitutions, improvements, and the like made within the spirit and principle of the present disclosure shall be included within the protection scope of the present disclosure.

What is claimed is:

1. An angle adjusting structure for a display, comprising:

at least one first support;

at least one second support connected to the display; and at least one up-down tilt adjusting structure which is arranged on the at least one first support and the at least one second support and is configured to enable each of the at least one second support to rotate relative to a corresponding first support of the at least one first support, wherein a position of a virtual pivot shaft of the each of the at least one second support is not fixed;

wherein two up-down tilt adjusting structures are provided, each of the two up-down tilt adjusting structures comprises an arc-shaped sliding groove, a mounting hole and a first adjusting elements, the first adjusting element is inserted in the arc-shaped sliding groove and the mounting hole, the first adjusting element is in sliding fit with the arc-shaped sliding groove;

wherein one of the at least one first support and the at least one second support is provided with the two arc-shaped sliding grooves, and centers of circles where the two arc-shaped sliding grooves of the two up-down tilt adjusting structures located on the same first support or the same second support are located do not coincide; and the other one of the at least one first support and the at least one second support is provided with two mounting holes of the two up-down tilt adjusting structures arranged at an interval.

2. The angle adjusting structure for the display according to claim 1, wherein the virtual pivot shaft passes through a gravity center of the display.

3. The angle adjusting structure for the display according to claim 1, wherein the centers of circles where the two arc-shaped sliding grooves are located are both located on a same side of the at least one first support or the at least one second support away from the virtual pivot shaft.

4. The angle adjusting structure for the display according to claim 1, wherein the centers of circles where the two arc-shaped sliding grooves are located are both located on a side of the at least one first support or the at least one second support close to the virtual pivot shaft.

5. The angle adjusting structure for the display according to claim 1, wherein the first adjusting element comprises a first abutting block and a first sliding element connected to the first abutting block, the first sliding element is inserted in the arc-shaped sliding groove and the mounting hole, and the first abutting block abuts against a surface of a corresponding second support of the at least one second support.

6. The angle adjusting structure for the display according to claim 1, wherein the angle adjusting structure for the display further comprises second adjusting elements, the second adjusting elements are arranged between each of the at least one second support and a corresponding first support of the at least one first support, each of the second adjusting elements can be in sliding fit with a corresponding arc-shaped sliding groove of the two arc-shaped sliding grooves, and the second adjusting elements are provided with assembly holes for two first adjusting elements of the two up-down tilt adjusting structures to penetrate through.

7. The angle adjusting structure for the display according to claim 6, wherein each of the second adjusting elements comprises a second abutting block and a second sliding element connected to the second abutting block, the second sliding element is in sliding fit with the arc-shaped sliding groove, and the second abutting block is clamped between the each of the at least one second support and the corresponding first support.

8. The angle adjusting structure for the display according to claim 1, wherein the angle adjusting structure for the display further comprises a supporting frame, and the at least one first support is connected to the supporting frame; and the angle adjusting structure for the display comprises two first supports, and the two first supports are slidably connected to the supporting frame.

9. The angle adjusting structure for the display according to claim 3, wherein the first adjusting element comprises a first abutting block and a first sliding element connected to the first abutting block, the first sliding element is inserted in the arc-shaped sliding groove and the mounting hole, and the first abutting block abuts against a surface of a corresponding second support of the at least one second support.

10. The angle adjusting structure for the display according to claim 4, wherein the first adjusting element comprises a first abutting block and a first sliding element connected to the first abutting block, the first sliding element is inserted in the arc-shaped sliding groove and the mounting hole, and the first abutting block abuts against a surface of a corresponding second support of the at least one second support.

11. The angle adjusting structure for the display according to claim 3, wherein the angle adjusting structure for the display further comprises second adjusting elements, the second adjusting elements are arranged between each of the at least one second support and a corresponding first support of the at least one first support, each of the second adjusting elements can be in sliding fit with a corresponding arc-shaped sliding groove of the two arc-shaped sliding grooves, and the second adjusting elements are provided with assembly holes for two first adjusting elements of the two up-down tilt adjusting structures to penetrate through.

12. The angle adjusting structure for the display according to claim 4, wherein the angle adjusting structure for the display further comprises second adjusting elements, the second adjusting elements are arranged between each of the at least one second support and a corresponding first support of the at least one first support, each of the second adjusting elements can be in sliding fit with a corresponding arc-shaped sliding groove of the two arc-shaped sliding grooves, and the second adjusting elements are provided with assembly holes for two first adjusting elements of the two up-down tilt adjusting structures to penetrate through.

13. The angle adjusting structure for the display according to claim 2, wherein the angle adjusting structure for the display further comprises a supporting frame, and the at least one first support is connected to the supporting frame; and the angle adjusting structure for the display comprises two first supports, and the two first supports are slidably connected to the supporting frame.

14. The angle adjusting structure for the display according to claim 1, wherein the angle adjusting structure for the display further comprises a supporting frame, and the at least one first support is connected to the supporting frame; and the angle adjusting structure for the display comprises two first supports, and the two first supports are slidably connected to the supporting frame.

15. The angle adjusting structure for the display according to claim 3, wherein the angle adjusting structure for the display further comprises a supporting frame, and the at least one first support is connected to the supporting frame; and the angle adjusting structure for the display comprises two first supports, and the two first supports are slidably connected to the supporting frame.

* * * * *